Figure 1:
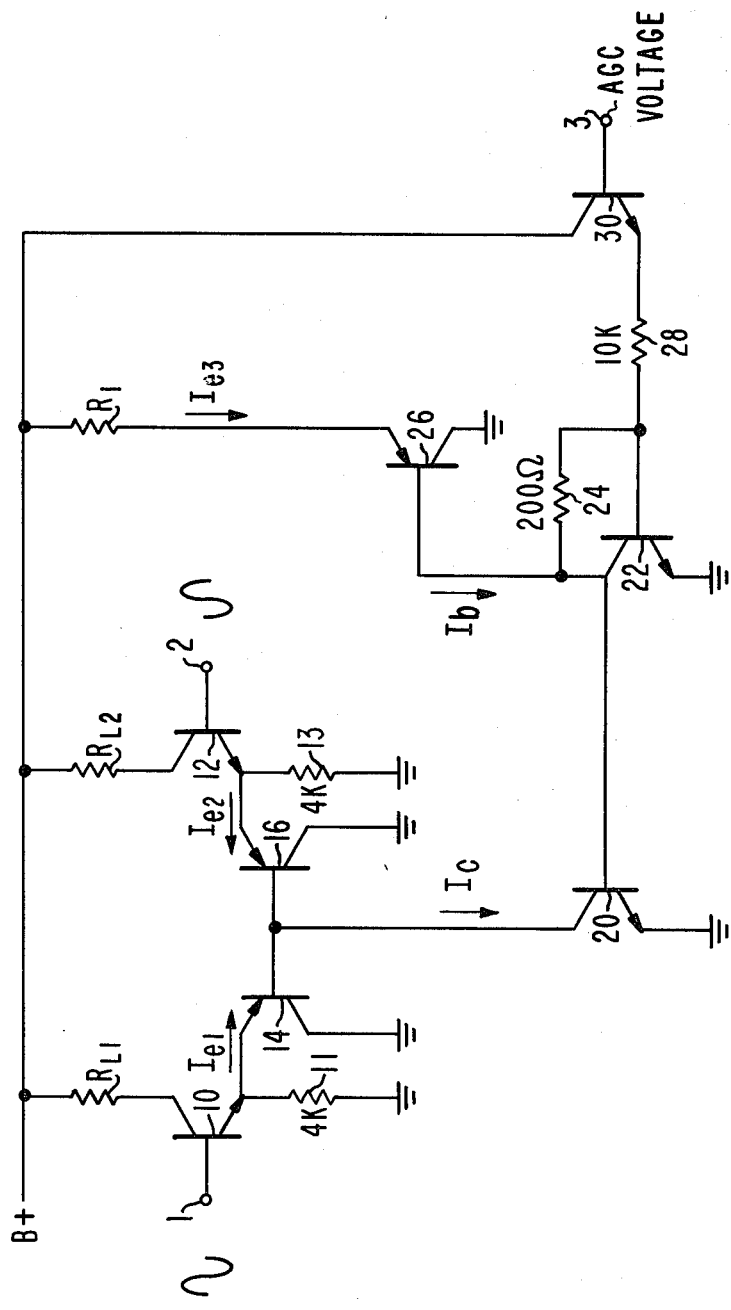

United States Patent [19]

Harford

[11] 4,378,528

[45] Mar. 29, 1983

[54] GAIN-CONTROLLED AMPLIFIER SYSTEM

[75] Inventor: Jack R. Harford, Flemington, N.J.

[73] Assignee: RCA Corporation, New York, N.Y.

[21] Appl. No.: 249,611

[22] Filed: Mar. 31, 1981

[51] Int. Cl.³ .............................................. H03F 3/45
[52] U.S. Cl. .................................... 330/254; 330/283
[58] Field of Search ................ 330/254, 256, 279, 283

[56] References Cited

U.S. PATENT DOCUMENTS

| 3,942,181 | 3/1976 | Berrod et al. | 330/86 |
| 4,131,809 | 12/1978 | Baars | 307/303 |
| 4,134,078 | 1/1979 | Arai et al. | 330/254 |

OTHER PUBLICATIONS

"Monolithic TV IF System TBA 440", by E. Schatter, published in IEE Trans. on BTR, vol. BTR-18, No. 3, Aug. 1972, pp. 158 et seq.

Primary Examiner—James B. Mullins
Assistant Examiner—Gene Wan
Attorney, Agent, or Firm—Eugene M. Whitacre; William H. Meagher; W. Brinton Yorks, Jr.

[57] ABSTRACT

A gain-controlled amplifier is provided, including first and second common emitter-coupled amplifying transistors for receiving differential input signals. The emitter circuits of the amplifying transistors include first and second controlled resistance devices, having base electrodes coupled to each other and to a source of gain-control potential, collector electrodes coupled to a source of reference potential, and respective emitter electrodes coupled to respective emitter electrodes of the amplifying transistors. Each of the controlled resistance devices includes a region of high resistivity (intrinsic) semiconductor material between the base and emitter electrodes, which gives the base-to-emitter junction of the device a PIN diode-like characteristic. The application of a gain-control potential to the bases of the devices may be used to vary both the small base-to-emitter current and the relatively larger emitter-to-collector current in the devices. Variation of the base-to-emitter current will vary the PIN diode junction resistances and hence the resistances in the emitter circuits of the amplifying transistors, and therefore will control the emitter degeneration of the amplifying transistors. The source of emitter-to-collector current for the devices is the D.C. emitter current of the amplifying transistors. As this current flow is varied, the D.C. biasing of the amplifying transistors is varied, which alters the transconductance of the amplifying transistors. Gain control is thus provided by the two techniques of variable transistor transconductance and variable emitter degeneration.

7 Claims, 3 Drawing Figures

GAIN-CONTROLLED AMPLIFIER SYSTEM

This invention relates to gain-controlled transistor amplifier circuits and, more particularly, to a gain-controlled transistor amplifier, including a variable resistance device, in which gain is controlled by varying the transconductance and the emitter degeneration of the amplifying transistor.

A gain-controlled amplifier, such as the intermediate frequency (I.F.) amplifier of a television receiver, must be able to accommodate a wide range of input signal levels while maintaining a substantially constant level output signal. For very weak input signals, the amplifier must provide high gain, typically ranging up to 60 db. When receiving very strong input signals, very low gain, or even attenuation, is necessary to maintain the desired output signal level. These performance requirements are satisfactorily met by the multistage I.F. amplifier system described in my pending U.S. patent application Ser. No. 06/163,143, entitled "TELEVISION INTERMEDIATE FREQUENCY AMPLIFIER", filed June 26, 1980. One amplifier stage of this system utilizes the technique of controlled emitter degeneration for gain control, and is described in greater detail in my pending U.S. patent application Ser. No. 06/143,035 (now U.S. Pat. No. 4,345,214), entitled "VARIABLE EMITTER DEGENERATION GAIN-CONTROLLED AMPLIFIER", filed Apr. 23, 1980. The amplifier described in this second patent application includes an amplifying transistor which is resistively coupled in a common emitter amplifier configuration with a fixed collector load resistor. The emitter circuit of the amplifying transistor includes a controlled resistance device having a base electrode coupled to the emitter electrode of the amplifying transistor, an emitter electrode coupled to receive a variable gain-controlling current and a collector electrode coupled to a point of reference potential. The controlled resistance device includes a region of high resistivity (intrinsic) semiconductor material between the base and emitter electrodes, which gives the base-to-emitter junction of the device a PIN diode-like characteristic. At signal frequencies, the base-to-emitter junction of the device acts as a resistance which varies inversely with the flow of gain-controlling current through the collector-to-emitter path of the device. Varying the resistance of the base-to-emitter junction of the device varies the impedance of the emitter circuit and the degeneration of the amplifying transistor, which varies the gain of the amplifier. The collector-to-emitter path of the device, through which the gain-controlling current flows, is separate from the biasing circuitry of the amplifying transistor, and hence modulation of the resistance of the device will not affect the D.C. biasing of the amplifying transistor. This amplifier is advantageous in that the emitter degeneration of the amplifying transistor is varied by the gain-controlling current without disturbing the D.C. biasing of the amplifying transistor.

The present invention uses the advantages of the controlled resistance device described in the above U.S. patent application Ser. No. 06/143,035 in an arrangement in which the controlled resistance device is modulated by a gain control potential to vary its resistance, and hence the gain of an amplifying transistor through emitter degeneration. In addition, the gain control potential varies the D.C. biasing current of the amplifying transistor to vary its transconductance ($g_m$) and hence the gain of the amplifier. This dual technique of gain control can afford a wide range of gain control, through the combined gain-control mechanisms of emitter degeneration variation and transistor transconductance variation.

In accordance with the principles of the present invention, a gain-controlled amplifier is provided, including first and second common emitter-coupled amplifying transistors for receiving differential input signals. The emitter circuits of the amplifying transistors include first and second controlled resistance devices, having base electrodes coupled to each other and to a source of gain-control potential, collector electrodes coupled to a source of reference potential, and respective emitter electrodes coupled to respective emitter electrodes of the amplifying transistors. Each of the controlled resistance devices includes a region of high resistivity (intrinsic) semiconductor material between the base and emitter electrodes, which gives the base-to-emitter junction of the device a PIN diode-like characteristic. At signal frequencies, the base-to-emitter junction of the device acts as a resistance which varies as a function of the base current biasing of the devices, thereby providing controlled emitter degeneration for the amplifying transistors. The controlled resistance device performs in a superior manner as compared with a junction diode, because the resistance of the base-to-emitter junction may be varied in a linear manner, without signal rectification. This avoids the non-linear conduction characteristic of a conventional diode.

Advantage is taken of the three-terminal structure of the controlled resistance devices. The gain-control potential applied to the bases of the devices may be used to vary both the small base-to-emitter current and the relatively larger emitter-to-collector current in the devices. Variation of the base-to-emitter current will vary the resistances in the emitter circuits of the amplifying transistors, and therefore will control the emitter degeneration of the amplifying transistors. The source of emitter-to-collector current for the devices in the D.C. emitter current of the amplifying transistors. As this current flow is varied, the D.C. biasing of the amplifying transistors is varied, which alters the transconductance of the amplifying transistors. Gain control is thus provided by the two techniques of variable transistor transconductance and variable emitter degeneration.

It is seen that gain control in this amplifier is achieved by varying the base currents supplied to the controlled resistance devices. It has been found that these base currents are relatively small in magnitude, and that a precision gain control current generator is needed to accurately control them. In accordance with a further aspect of the present invention, the gain-controlled amplifier includes a gain control signal generator which varies the amplifier gain by varying the supply voltage applied to the amplifying transistors and the controlled resistance devices. The variable supply voltage is applied to the collector electrodes of the amplifying transistors. Applying the gain control signal in this manner eliminates the need for direct precise base current control, and permits the gain control signal to be filtered prior to its application to the amplifying transistors, thereby minimizing the injection of intermodulating noise into the amplifier.

Figure 2A:
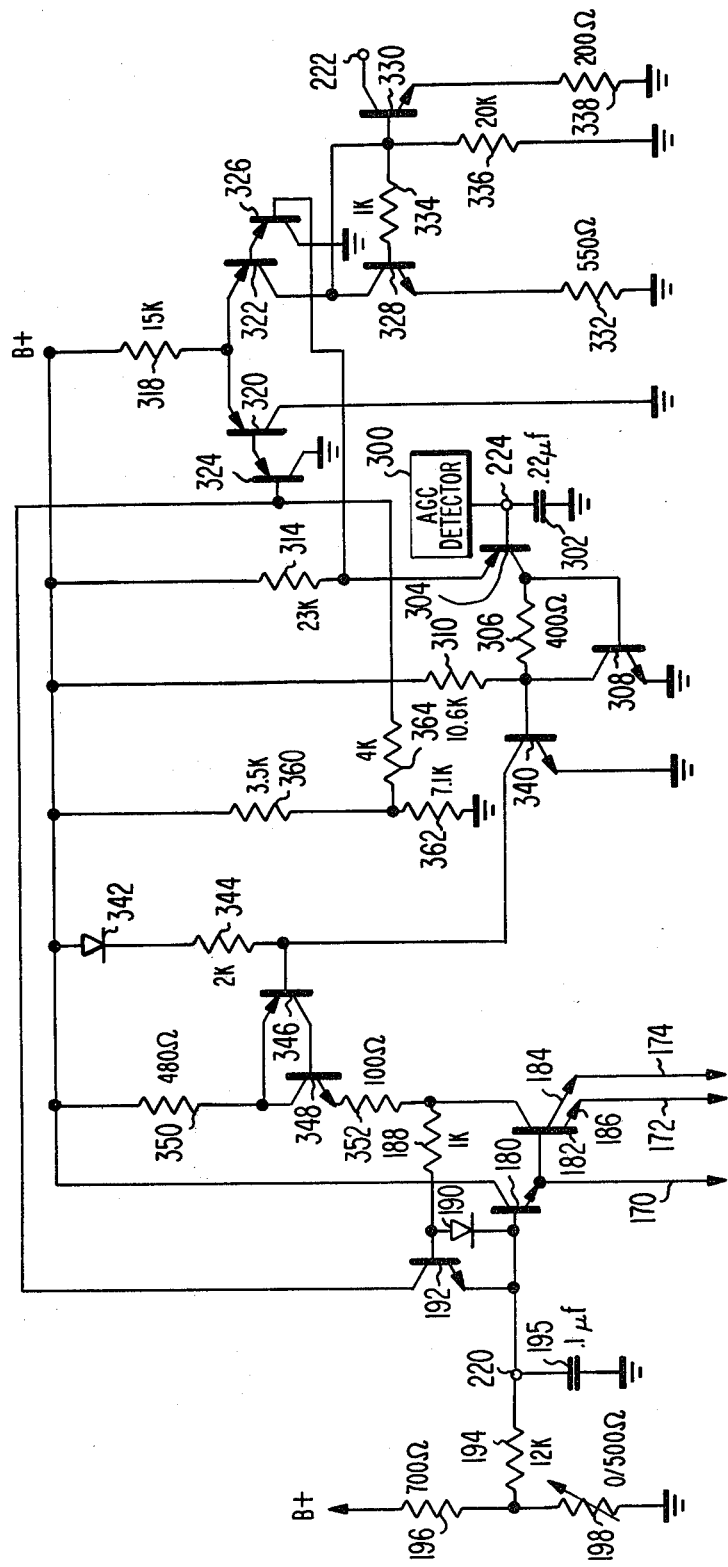
Figure 2B:
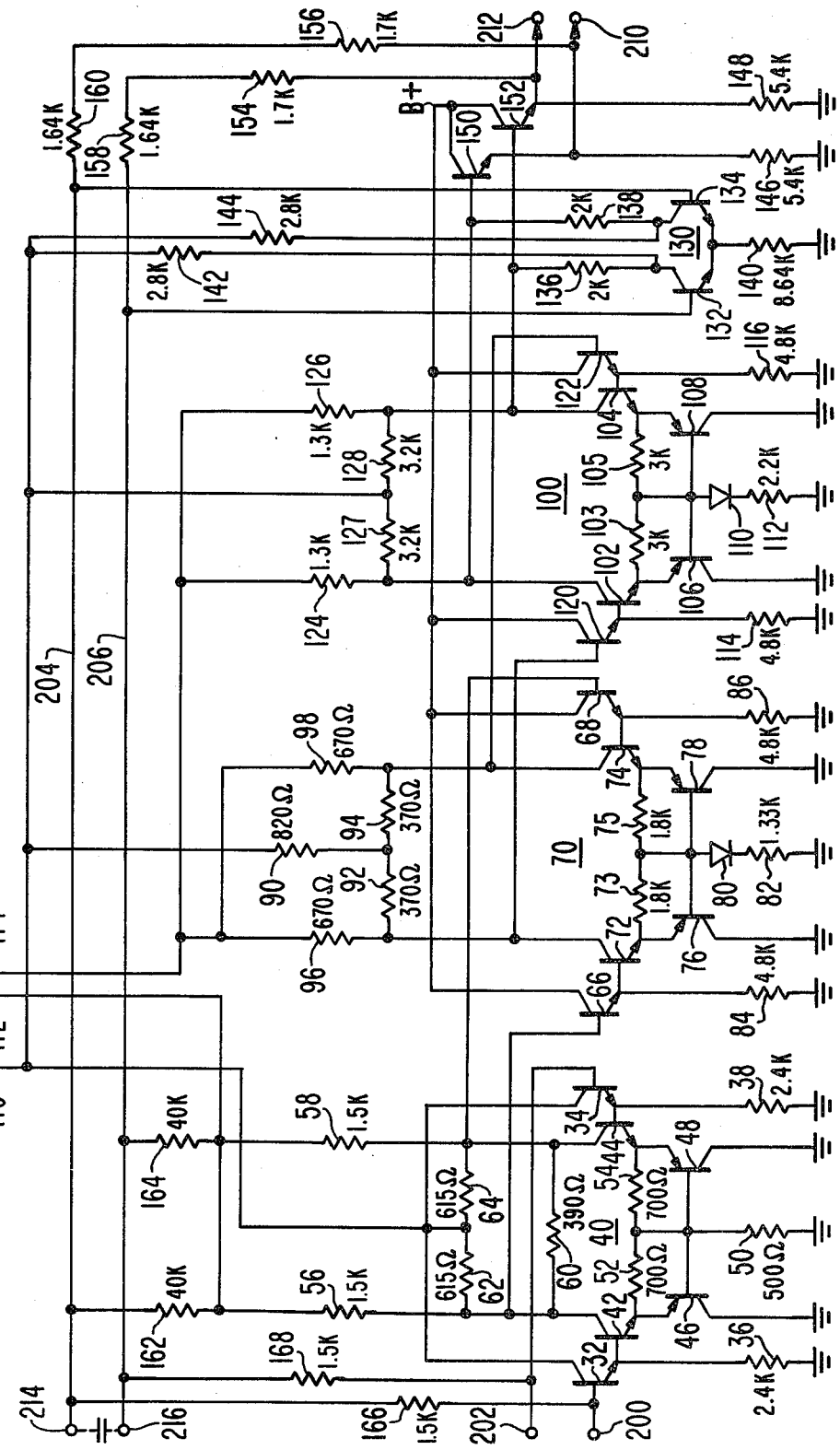

In the drawings:

FIG. 1 illustrates, in schematic diagram form, a gain-controlled amplifier system constructed in accordance with the principles of the present invention; and FIGS. 2a and 2b illustrate, partially in block diagram form and partially in schematic diagram form, a gain-controlled amplifier system in which the gain of the amplifying stages is controlled by varying the supply voltage to the stages.

Referring to FIG. 1, signal input terminals 1 and 2 are adapted for receiving differential input signals and are coupled to bases of amplifying transistors 10 and 12. The collectors of the respective transistors are coupled to a source of supply voltage (B+) by load resistors $R_{L1}$ and $R_{L2}$. The emitters of the transistors are coupled to a source of reference potential (ground) by resistors 11 and 13. The emitters of transistors 10 and 12 are also coupled to the emitters of variable resistance devices 14 and 16, respectively.

The collectors of devices 14 and 16 are coupled to ground, and their bases are coupled to each other and to the collector of a transistor 20. The emitter of transistor 20 is coupled to ground, and its base is coupled to the collector of a transistor 22. The collector of transistor 22 is coupled to the base of a transistor 26. A resistor 24 is coupled between the collector and the base of transistor 22, and the emitter of the transistor is coupled to ground. The collector of transistor 26 is coupled to ground, and its emitter is coupled to the B+ supply by a resistor $R_1$. The base of transistor 22 is coupled to the emitter of a transistor 30 by a resistor 28. The collector of transistor 30 is coupled to the B+ supply, and its base is coupled to a terminal 3, to which a gain control (AGC) potential is applied.

The variable resistance devices 14 and 16 may be constructed in a similar manner as PNP transistors, but differ from conventional PNP transistors in that a region of high resistivity (intrinsic) semiconductor material is interposed between the base and emitter regions of each device. The intrinsic region separates the P+ emitter region and the N+ base contact region of each device by a distance which is greater than the diffusion length of minority carriers injected into the intrinsic region from the emitter region in response to the bias potential developed by the flow of gain control current applied to the base electrodes of the devices.

The emitter-base junction of each device thus acts as a nonrectifying PIN diode to high frequency (i.e., greater than one Megahertz) signals. The resistance of the emitter-base junction of the device is controlled by the flow of gain control current from transistor 20 and will decrease as the flow of gain control current increases. The PIN diode-like junction is also characterized by a very low junction capacitance, which permits a relatively large range of impedance control. These devices have been constructed and tested and it has been found that the predominant high frequency signals at the emitters of transistors 10 and 12 flow through the emitter-to-base paths of devices 14 and 16, and very little high frequency signal components flow through the emitter-to-collector paths of the devices, the latter conducting primarily D.C. currents.

The quiescent operating condition of the arrangement of FIG. 1 will first be considered. It is seen that the gain control current applied to devices 14 and 16 comprises small magnitude base current components. A simple technique for developing these currents is to analyze the arrangement in terms of the relationship of the emitter currents $Ie_1$ and $Ie_2$ of the devices to the emitter current $Ie_3$ of transistor 26. The magnitude of resistor $R_1$ is chosen to provide a certain emitter current flow, $Ie_3$, in transistor 26. This current flow is translated to a base current flow $I_b$ in the transistor, which is applied to the collector of transistor 22. Resistor 24 couples the collector of transistor 22 to its base, so that transistor 22 functions in a manner similar to a diode and is therefore in a current repeating configuration with transistor 20. Current $I_b$ flows through the collector-to-emitter path of transistor 22, and is replicated proportionally as collector current $I_c$ in transistor 20 as a function of the relative emitter areas of the transistor 20 and 22. If the emitter area of transistor 20 is twice that of transistor 22, for example, $I_c$ will be twice $I_b$. With devices 14 and 16 being matched in size to each other and to transistor 26, current $I_c$ is divided to provide base current for devices 14 and 16 which result in emitter currents $Ie_1$ and $Ie_2$ being equal to each other and to current $Ie_3$. Thus, gain control current $I_c$, which, like current $I_b$, is of a base current magnitude, is translated back to emitter currents by devices 14 and 16. By selecting a value of resistor $R_1$ to establish a known current $Ie_3$, the quiescent operating condition of the arrangement is easily determined in this manner. In addition, since current $I_b$ is developed by the transistor 26 which is matched in characteristics to devices 14 and 16, current $I_b$ is beta-dependent because it is a function of the beta of transistor 26. Therefore, the control current supplied by transistor 20 is compensated for temperature variations and beta variation from one arrangement to another.

With the quiescent operating conditions established, an AGC voltage may be applied to the base of transistor 22 by transistor 30. Circuit elements 20–30 will respond to the AGC voltage by producing a translated gain control current for devices 14 and 16. These circuit elements operate in the manner described in my U.S. Pat. No. 3,579,133, entitled "SIGNAL TRANSLATING STAGE", whereby the AGC voltage is translated by elements 22–28 to provide $g_m$ control of transistor 20, which varies the base currents of devices 14 and 16 in a predictable manner. When the AGC voltage has a relatively low level, currents $Ie_1$ and $Ie_2$ can be controlled to be equal to current $Ie_3$. Under this condition, substantially all of current $I_b$ will be conducted by the collector of transistor 22. Only a very small component of current $I_b$ will flow in resistor 24, providing only a very small voltage drop across that resistor. The $I_b$ current flow will be replicated by transistor 20 as current $I_c$, in accordance with the ratio of the emitter areas of the two transistors. This follows because the base-emitter junctions of the two transistors are essentially connected in parallel. In this example, with a two-to-one ratio of emitter areas, $I_c$ will be twice $I_b$ providing base currents to devices 14 and 16 which cause currents $Ie_1$ and $Ie_2$ to be equal to each other and to $Ie_3$. Currents $Ie_1$ and $Ie_2$ will cause the base-to-emitter junctions of devices 14 and 16 to exhibit relatively low resistance values, which reduces the emitter degeneration and causes the amplifying transistors to provide relatively high amplification to the applied input signals.

When the AGC voltage is increased to a relatively higher level, current will flow through resistors 24 and 28 in a direction to increase the conductivity of transistor 22. With this increased conductivity, the DC collector potential of transistor 22 decreases, thereby decreasing the DC potential applied to the base of transistor 20. This renders transistor 20 relatively less conductive. The replicated current $I_c$ of transistor 20 will be reduced, causing reduction of currents $Ie_1$ and $Ie_2$. The base-to-emitter junctions of devices 14 and 16 will exhibit relatively higher resistance values, thereby increasing the emitter degeneration and reducing the gain of the amplifying transistors.

Currents $Ie_1$ and $Ie_2$ are supplied to the variable resistance devices 14 and 16 by the amplifying transistors 10 and 12. As these currents change in magnitude, the dynamic emitter resistance, $r_e$, of the amplifying transistors changes, thereby effecting a change in the $g_m$, and hence the gain, of the amplifying transistors. When currents $Ie_1$ and $Ie_2$ have relatively high levels, the value of $r_e$ is relatively low, and the gain of the amplifying transistors is relatively high. Conversely, as currents $Ie_1$ and $Ie_2$ are reduced, the value of $r_e$ of each amplifying transistor increases, and the gain of the amplifying transistors decreases. The sense of $g_m$ control of the amplifying transistors is the same as that of the variable resistance devices. Therefore, the AGC voltage is effective to control the gain of the arrangement of FIG. 1 through the simultaneous mechanisms of controlled $g_m$ variation of the amplifying transistors and controlled emitter degeneration. The use of both techniques provides the arrangement with a wide dynamic range of gain control.

In the arrangement of FIG. 1, the gain of the system is controlled by finely controlling the relatively small base currents of devices 14 and 16. In the arrangement of FIGS. 2a and 2b, the gain of similarly constructed amplifier stages is controlled by controlling the relatively coarser supply voltages for the amplifier stages. The arrangement of FIGS. 2a and 2b will provide the same accuracy in gain control as the arrangement of FIG. 1 even with more relaxed component tolerances.

Referring first to FIG. 2b, cascaded amplifying stages 40, 70 and 100 are shown. The first stage 40 includes amplifying transistors 42 and 44, and variable resistance devices 46 and 48, coupled in substantially the same manner as amplifying transistors 10 and 12 and devices 14 and 16 of FIG. 1. Input terminals 200 and 202 are coupled to supply input signals to amplifying transistors 42 and 44 by way of the base-emitter paths of emitter follower coupled buffer transistors 32 and 34. The buffer transistors buffer the input impedances at terminals 200 and 202 from the effects of the collector-base capacitances of amplifying transistors 42 and 44. The emitter of transistor 32 is coupled to ground by a resistor 36, and the emitter of transistor 34 is coupled to ground by a resistor 38. Resistors 52 and 54 are serially coupled between the emitters of transistors 42 abd 44, and a resistor 50 is coupled between the junction of resistors 52 and 54 and ground. The bases of devices 46 and 48 are also coupled to the junction of resistors 52 and 54.

A resistor 60 is coupled between the collectors of transistors 42 and 44. Resistors 62 and 64 are serially coupled between the collectors of transistors 42 and 44. The junction of resistors 62 and 64 is coupled to the collectors of transistors 32 and 34, and to a conductor 170. A gain control potential for the first stage 40 is supplied by way of a conductor 172, which is coupled to the collector of transistor 42 by a resistor 56, and to the collector of transistor 44 by a resistor 58.

First stage output signals at the collectors of transistors 42 and 44 are applied to the bases of buffer transistors 66 and 68 of the second stage 70. The emitter of transistor 66 is coupled to ground by a resistor 84, and to the base of an amplifying transistor 72. The emitter of transistor 68 is coupled to ground by a resistor 86, and to the base of an amplifying transistor 74. The collectors of transistors 66 and 68 are coupled to the B+ supply. The emitter of transistor 72 is coupled to the emitter of a variable resistance device 76, the collector of which is coupled to ground. The emitter of transistor 74 is coupled to the emitter of a variable resistance device 78, the collector of which is coupled to ground. Serially connected resistors 73 and 75 are coupled between the emitters of transistors 72 and 74. The junction of resistors 73 and 75 is coupled to the bases of devices 76 and 78, and to the anode of a diode 80. The cathode of diode 80 is coupled to ground by way of a resistor 82.

Resistors 92 and 94 are serially coupled between the collectors of transistors 72 and 74. The junction of resistors 92 and 94 is coupled to conductor 170 by way of a resistor 90. A conductor 174 applies a gain control potential to the collector of transistor 72 by way of a resistor 96, and to the collector of transistor 74 by way of a resistor 98.

Output signals from the collectors of the amplifying transistors 72 and 74 of the second stage 70 are applied to the bases of buffer transistors 120 and 122 of the third stage 100. The third stage 100 includes elements 102-116 which are coupled in the same manner as corresponding elements 72-86 of the second stage 70. In addition, serially connected resistors 127 and 128 are coupled between the collectors of third stage amplifying transistors 102 and 104. The junction of resistors 127 and 128 is coupled to conductor 170. Conductor 174 supplies gain control potential to the collector of transistor 102 by way of a resistor 124, and to the collector of transistor 104 by way of a resistor 126. Output signals at the collectors of transistors 102 and 104 are coupled to output terminals 210 and 212 by way of the base-emitter paths of emitter follower coupled transistors 150 and 152. The emitter of transistor 150 is coupled to ground by a resistor 146, and its collector is coupled to the B+ supply. The emitter of transistor 152 is coupled to ground by a resistor 148, and its collector is coupled to the B+ supply.

Feedback paths 204 and 206 provide filtered feedback signals from the output terminals 210 and 212 to the inputs of the first stage at terminals 200 and 202 to stabilize the operating conditions of the system. Feedback path 204 includes resistors 156 and 160, a terminal 214, and a resistor 166 serially coupled between terminals 210 and 200. Feedback path 206 includes resistors 154 and 158, a terminal 216, and a resistor 168 serially coupled between terminals 212 and 202. A pinch resistor 162 is coupled between terminal 214 and conductor 172, and a pinch resistor 164 is coupled between terminal 216 and conductor 172. Terminals 214 and 216 are adapted to be capacitively coupled to each other, or to a point of signal reference potential, to provide filtering and phase shift compensation of the feedback signals.

In order to provide feedback compensation during low gain conditions, during which time the D.C. feedback may be undesirably low, a differential amplifier 130 is coupled between the feedback paths 204 and 206 and the bases of transistors 150 and 152, in a smaller feedback loop. The differential amplifier 130 includes emitter-coupled transistors 132 and 134. A resistor 140 is coupled between the joined emitters and ground. The collector of transistor 132 is coupled to the base of transistor 152 by a resistor 136, and to conductor 170 by a resistor 142. The collector of transistor 134 is coupled to the base of transistor 150 by a resistor 138, and to conductor 170 by a resistor 144. The base of transistor 132 is coupled to terminal 216, and the base of transistor 134 is coupled to terminal 214. The differential amplifier 130 responds to changes in the feedback signal levels of paths 204 and 206 by varying the potentials at the bases of transistors 150 and 152, thereby providing stabilizing feedback signal levels over the full range of gain control.

FIG. 2a shows circuitry which provides the supply and gain control voltages for the amplifier stages of FIG. 2b by way of conductors 170, 172 and 174. When the arrangement of FIG. 2b is used as the I.F. amplification system of a television receiver, the arrangement of FIG. 2a advantageously may be used to provide the required gain control signals for both the I.F. and radio frequency (R.F.) amplification sections of the television receiver.

FIG. 2a shows an AGC detector 300 which is adapted to receive a signal processed by the amplifier stages of FIG. 2b, the level of which it is desired to stabilize to a given reference. The AGC detector 300 develops a control voltage representative of the level of the signal it receives, which voltage is stored by a capacitor 302, coupled between the output terminal 224 of the AGC detector 300 and ground. The circuitry of FIG. 2a translates this stored voltage into control signals on conductors 172 and 174 to control the gain of the amplifier stages 40, 70 and 100 of FIG. 2b.

Terminal 224 is coupled to the base of a transistor 304, the emitter of which is coupled to the B+ supply by a resistor 314. The collector of transistor 304 is coupled to the base of a transistor 308, and by way of a resistor 306 to the collector of transistor 308 and the base of a transistor 340. The emitter of transistors 308 and 340 are coupled to ground. The collector of transistor 308 is also coupled by way of resistor 310 to the B+ supply.

The collector of transistor 340 is coupled to the base of a transistor 346 and to one end of a resistor 344, the other end of which is coupled to the cathode of a diode 342. The anode of diode 342 is coupled to the B+ supply. The emitter of transistor 346 is coupled to the collector of a transistor 348, and to the B+ supply by way of a resistor 350. The collector of transistor 346 is coupled to the base of transistor 348. The emitter of transistor 348 is coupled to the collector of a transistor 182 by way of a resistor 352. One end of a resistor 188 is coupled to the collector of transistor 182, and the other end of resistor 188 is coupled to the anode of a diode 190 and the base of a transistor 192. The cathode of diode 190 is coupled to the emitter of transistor 192, a terminal 220, and the base of a transistor 180. A voltage divider, including the serial connection of a resistor 196 and a potentiometer 198, is coupled between B+ and ground. The junction of resistor 196 and potentiometer 198 is coupled by a resistor 194 to terminal 220. A capacitor 195 is coupled between terminal 220 and ground. The collector of transistor 180 is coupled to the B+ supply, and its emitter is coupled to the conductor 170 and the base of transistor 182. Transistor 182 has a first emitter 186 coupled to conductor 172, and a second emitter 184 coupled to conductor 174.

A voltage divider, including serially connected resistors 360 and 362, is coupled between the B+ supply and ground. The junction of resistors 360 and 362 is coupled to the base of transistor 324 by a resistor 364. The collector of transistor 192 is connected to the base of transistor 324. The collector of transistor 324 is coupled to ground, and its emitter is coupled to the base of a transistor 320. The collector of transistor 320 is coupled to ground, and its emitter is coupled to the emitter of a transistor 322, and to the B+ supply by way of a resistor 318. The base of transistor 322 is coupled to the emitter of a transistor 326, and its collector is coupled to the collector of a transistor 328 and to the base of a transistor 330. The collector of transistor 326 is coupled to ground, and its base is coupled to the junction of resistor 314 and the emitter of transistor 304. The emitter of transistor 328 is coupled to ground by a resistor 332, and its base is coupled to the base of transistor 330 by a resistor 334. A resistor 336 is coupled between the base of transistor 330 and ground, and a resistor 338 is coupled between the emitter of transistor 330 and ground. The collector of transistor 330 is coupled to an output terminal 222.

In operation, the AGC detector 300 will develop a voltage level across capacitor 302 which is representative of any departure of the signal level at output terminals 210 and 212 from the desired signal level. When the output signal level is lower than desired, the AGC detector will cause the voltage across capacitor 302 to be relatively high. This will render transistor 304 relatively less conductive. Resistor 306 and transistors 308 and 340 correspond to resistor 24 and transistors 22 and 20 of FIG. 1, and operate in the same fashion. With transistor 304 rendered relatively less conductive, the current supplied by resistor 310 will be conducted by transistor 308, with only a small portion of that current flowing through resistor 306 causing a negligible voltage drop across it. The current conducted by transistor 308 will be replicated by transistor 340 in proportion to the area ratio of the two devices, and a significant current will flow through transistor 340 from diode 342 and resistor 344.

The collector current of transistor 340 is replicated by transistors 346 and 348 to produce a substantial emitter current flow in transistor 348. Virtually all of this current will be conducted as the collector current of transistor 182, with a small portion of the current being diverted to the base of transistor 192 by way of a resistor 188 and diode 190.

As a result of the signal translations performed by this circuit, the current supplied to the collector or transistor 182 may become contaminated with noise components. These noise components, if applied to the amplifying stages with the gain control signal, can cause intermodulation distortion and noise contamination of the signals being amplified. In the arrangement of FIG. 2a, noise components are filtered from the gain control signals just prior to their application to the amplifying stages of FIG. 2b. This is accomplished by capacitor 195, which filters the current supplied to the base of transistor 180. This filtering action removes noise components from the base of transistor 180. The potential at the emitter of transistor 180 is therefore noise-free, since the signal at this point is provided by the noise-free base current of the transistor. The transistor 180 also provides an impedance transformation between terminal 220 and conductor 170, which permits the use of components of reasonable value for the R.F. AGC delay function to be discussed below. The noise-free current at the emitter of transistor 180 is supplied by way of conductor 170 to the collectors of the amplifying transistors of FIG. 2b, as well as to the collectors of buffer transistors 32 and 34. The noise performance of these latter two transistors is important, because they are the first two signal transistors in the amplifier and are likely to receive very low signal levels for amplification by the first stage 40. By filtering the supply currents supplied to these transistors, the contamination of the low level signals conducted by them is reduced. The buffer transistors 66, 68, 120 and 122 of the second and third stages receive signals at significantly higher levels by virtue of the amplification provided by stage 40. Accordingly, the collectors of these transistors may be connected to the B+ supply.

The noise-free emitter current of transistor 180 will similarly supply the base current of transistor 182 so that the gain control currents supplied by emitters 184 and 186 will be relatively free of noise components present at the collector of transistor 182. The gain control current supplied by conductor 172 to the first stage 40 will have a significant magnitude due to the significant magnitude of the collector current of transistor 182 in this example. This current is applied to the collectors of amplifying transistors 42 and 44 by resistors 56 and 58, where its conduction by the amplifying transistors produces relatively small $r_e$ values in these transistors. The amplifying transistors will therefore exhibit relatively large $g_m$ values and high gain. The sizeable emitter currents of transistors 42 and 44 are also applied to variable resistance devices 46 and 48, causing them to exhibit low values of base-to-emitter resistance. Emitter degeneration in the stage is reduced, further increasing the gain of the stage. A similar result will be obtained in the second and third stages due to current provided by conductor 174.

When the AGC detector 300 detects a larger than desired output signal from the amplifying stages, the gain of the stages is reduced. The voltage stored by capacitor 302 will be reduced in magnitude, causing increased conduction by transistor 302. This will cause increased conduction by transistor 308, which will render transistor 340 less conductive. The reduced current flow of transistor 340 will be replicated by transistors 346 and 348, and a lesser current will be conducted to the collector of transistor 182. The gain control currents on conductors 172 and 174 will be reduced accordingly. This will cause the $r_e$ values of the amplifying transistors to increase, which reduces the $g_m$ and hence the gain of the amplifying stages. The decreased currents provided to the variable resistance devices will cause them to exhibit higher resistances, which increases the emitter degeneration and reduces the gain of the amplifying stages.

The values of the resistors connected between the emitters of the amplifying transistors, including resistors 52, 54, 73, 75, 103 and 105, are chosen to provide desired ranges of $r_e$ for the respective stages, and determine the carrier signal drop across the base-emitter junctions of the amplifying transistors. These resistors conduct substantially constant currents during gain changes, and are effective to maintain linear operation of the amplifying transistors during conditions of low gain or attenuation. The variable DC current conducted by the variable resistance devices during gain change are effective to vary the $r_e$ values of the amplifying transistors over their respective ranges.

But since these six emitter resistors are respectively connected across the base-emitter junctions of the variable resistance devices, the voltage across them will change with changing temperature. To compensate for these temperature changes, which would otherwise cause temperature-dependent changes in amplifier gain, the voltages applied to the collectors of the stages are made temperature dependent. It is seen that the voltage applied to collector resistors 62, 64; 92, 94; and 127, 128 by conductor 170 is one diode voltage ($V_{be}$) above the gain control voltages of conductors 172 and 174 by virtue of the base-to-emitter voltage drops of transistor 182. This $V_{be}$ differential introduces a temperature-dependent term into the collector bias voltages, which offsets the temperature-dependent effects of the emitter resistors.

The values of the collector resistors are chosen to provide the desired gain control transfer characteristic; that is, the rates of gain control of the stages and the signal levels at which the control of the various stages begins and ends. For instance, it is seen in the embodiment of FIG. 2b that the values of the collector resistors of the third stage 100 are greater than the collector resistor values of the second stage 70. This will cause the third stage to transverse its range of gain control before the second stage has reached the limits of its gain control range as signal levels increase and gain is reduced. The relative values of the collector resistors of the stages determines the ratio in which the collector current of transistor 182 divides to flow through emitter 184 and 186 of the transistor.

When used in a television receiver, the arrangement of FIG. 2a may also be used to provide an R.F. AGC signal for the radio frequency amplifier section of the receiver. It is generally desirable to adjust the gain control circuit so that reduction of R.F. gain begins as the I.F. amplifiers are reaching a 40–50 db level of gain reduction. Thus, R.F. gain reduction must be delayed until the signal strength reaches that level of gain control. This is accomplished in the embodiment of FIG. 2a by adjusting potentiometer 198 to cause a certain current to flow into terminal 220. The current at terminal 220 is applied to the emitter of transistor 192 to control the reference bias voltage at the base of transistor 324. This voltage is applied as a reference voltage for transistors 324 and 320 of a differential amplifier, which includes transistors 320, 322, 324 and 326. For low signal levels, during which R.F. gain control does not occur, this reference voltage causes transistors 324 and 320 to be rendered relatively conductive, and transistors 322 and 326 are relatively nonconductive.

As the detected signal level increases, the voltage across capacitor 302 decreases, and transistor 304 becomes increasingly conductive. Transistor 304 conducts current through resistor 314, and the voltage drop across this resistor increases with increasing current flow. The voltage at the junction of transistor 304 and resistor 314 is applied to the base of transistor 326. As the voltage at this point decreases, it will eventually fall below the reference voltage level at the base of transistor 324. When this happens, transistors 320 and 324 will begin to turn off and transistors 322 and 326 will become increasingly conductive to initiate R.F. gain reduction.

The collector current of conductive transistor 322 is applied to the bases of transistors 328 and 330. Most of this collector current flows through the collector-to-emitter path of transistor 328, which is diode-connected by the coupling of its collector to its base by resistor 334. Transistor 328 cooperates with transistor 330 to form a compensated ratio amplifier, in which conduction by transistor 328 causes transistor 330 to begin conducting current in a predetermined manner.

The collector of transistor 330 is coupled to terminal 222, which in turn may be coupled to apply a gain control signal to an R.F. amplifier. The collector current flow of transistor 330 is thus used to reduce the gain of the R.F. amplifier.

What is claimed is:

1. A gain-controlled amplifier system comprising:

first and second amplifying transistors, each having a base electrode for receiving input signals, a collector electrode at which output signals are derived, and an emitter electrode;

first and second resistive impedances respectively coupled between the respective collector electrodes of said amplifying transistors and a source of supply voltage;

first and second variable resistance devices each having an emitter electrode coupled to a respective emitter electrode of one of said amplifying transistors, a collector electrode coupled to a point of reference potential, and a base electrode, the base electrodes of said variable resistance devices being coupled together, and each of said devices including a region of substantially intrinsic semiconductor material located between base and emitter regions of opposite type conductivity semiconductor material; and a source of variable gain control potential coupled to said first and second amplifying transistors and said first and second variable resistance devices so as to develop biasing currents in said first amplifying transistor and said first device, and in said second amplifying transistor and said second device;

wherein variation of said gain control potential effects variations of said biasing currents to alter the respective resistances exhibited by said base-to-emitter junctions of said devices and the respective transconductances of said amplifying transistors in respective directions having like effects on the gain of said amplifier.

2. The gain-controlled amplifier system of claim 1, wherein said source of gain control potential includes:

a source of control voltage;

a third transistor having an emitter electrode coupled to a point of reference potential, a base electrode coupled to said source of control voltage and a collector electrode;

a first resistor coupled between said base and collector electrodes of said third transistor;

a second resistor coupled between said collector electrode of said third transistor and a source of supply voltage; and a fourth transistor having an emitter electrode coupled to a point of reference potential, a base electrode coupled to the collector electrode of said third transistor, and a collector electrode direct current coupled to the base electrodes of said variable resistance devices.

3. The gain controlled amplifier system of claim 1, wherein said source of gain control potential includes:

a source of control voltage;

a third transistor having an emitter electrode coupled to a point of reference potential, a base electrode coupled to said source of control voltage and a collector electrode;

a first resistor coupled between said base and collector electrodes of said third transistor;

a second resistor coupled between said collector electrode of said third transistor and a source of supply voltage;

a fourth transistor having an emitter electrode coupled to a point of reference potential, a base electrode coupled to the collector electrode of said third transistor, and a collector electrode at which a gain control current is produced; and a current translating circuit having an input coupled to the collector electrode of said fourth transistor, and an output coupled to the collector electrodes of said amplifying transistors for applying gain control currents to said amplifying transistors and said variable resistance devices.

4. The gain controlled amplifier system of claim 1, wherein said source of variable gain control potential comprises:

a source of variable control current;

a current translating circuit having an input coupled to said source of control current and an output;

a third transistor having a base electrode coupled to the output of said current translating circuit, a collector electrode coupled to said source of supply voltage, and an emitter electrode coupled to said first and second resistive impedances; and a capacitor coupled between said base electrode of said third transistor and a point of reference potential;

wherein said capacitor provides filtering at said base electrode of said third transistor, and said third transistor emitter electrode provides a source of filtered supply voltage for said first and second amplifying transistors of said first and second variable resistance devices.

5. The gain controlled amplifier system of claim 4, wherein said source of variable gain control potential further comprises:

a fourth transistor having a collector electrode coupled to said output of said current translating circuit, a base electrode coupled to the emitter electrode of said third transistor, and an emitter electrode; and means for coupling said emitter electrode of said fourth transistor to said collector electrodes of said amplifying transistors;

wherein said fourth transistor and said coupling means provide a source of temperature compensated control potential for said amplifying transistors and said variable resistance devices.

6. The gain controlled amplifier system of claims 1 or 5, further comprising:

third and fourth resistive impedances serially coupled between the emitter electrodes of said amplifying devices;

a fifth resistive impedance coupled between the base electrodes of said variable resistance devices and said point of reference potential; and means for coupling the junction of said serially coupled third and fourth resistive impedances to said base electrodes of said variable resistance devices.

7. The gain controlled amplifier system of claims 4 or 5, further comprising:

means, coupled to said souce of variable control current, for producing a variable voltage exhibiting a magnitude which is a function of said control current;

a delayed gain control signal circuit including a differential amplifier having a first input for receiving a reference voltage, a second input coupled to said variable voltage producing means, and an output at which a delayed gain control signal is produced when said variable voltage exhibits a first polarity with respect to said reference voltage;

a voltage divider, coupled across two terminals of a power supply, and having an intermediate tap coupled to said base electrode of said third transistor; and means for coupling said intermediate tap of said voltage divider to said first input of said differential amplifier, whereby said reference voltage for said delayed gain control signal circuit is a function of the voltage at said intermediate tap of said voltage divider.

* * * * *